US008387067B2

(12) United States Patent
Prakash

(10) Patent No.: US 8,387,067 B2
(45) Date of Patent: Feb. 26, 2013

(54) METHOD FOR TRACKING AND/OR VERIFYING MESSAGE PASSING IN A SIMULATION ENVIRONMENT

(75) Inventor: Babu H. Prakash, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 1183 days.

(21) Appl. No.: 12/075,905

(22) Filed: Mar. 14, 2008

(65) Prior Publication Data
US 2009/0235278 A1    Sep. 17, 2009

(51) Int. Cl.
G06F 13/00 (2006.01)
G06F 3/00 (2006.01)
G06F 3/06 (2006.01)

(52) U.S. Cl. ............... 719/313; 719/312; 710/2; 710/3; 711/4

(58) Field of Classification Search .................. None
See application file for complete search history.

(56) References Cited

U.S. PATENT DOCUMENTS

| | | | | |
|---|---|---|---|---|
| 5,752,002 | A * | 5/1998 | Naidu et al. | 703/14 |
| 6,088,777 | A * | 7/2000 | Sorber | 711/171 |
| 6,125,399 | A * | 9/2000 | Hamilton | 709/245 |
| 6,185,569 | B1 * | 2/2001 | East et al. | 1/1 |
| 6,571,204 | B1 * | 5/2003 | Meyer | 703/22 |
| 7,155,537 | B1 * | 12/2006 | Weber et al. | 709/249 |
| 7,500,046 | B1 * | 3/2009 | Puri et al. | 710/311 |
| 7,555,549 | B1 * | 6/2009 | Campbell et al. | 709/224 |
| 2002/0103950 | A1 * | 8/2002 | Stypmann et al. | 710/65 |
| 2002/0165838 | A1 * | 11/2002 | Vetter | 706/20 |
| 2003/0033477 | A1 * | 2/2003 | Johnson et al. | 711/114 |
| 2003/0200548 | A1 * | 10/2003 | Baran et al. | 725/90 |
| 2004/0102944 | A1 * | 5/2004 | Shortz | 703/14 |
| 2004/0102978 | A1 * | 5/2004 | Gygi et al. | 704/275 |
| 2004/0243334 | A1 * | 12/2004 | Wrigley et al. | 702/108 |
| 2005/0004777 | A1 * | 1/2005 | Houlihane | 702/119 |
| 2005/0223118 | A1 * | 10/2005 | Tucker et al. | 709/250 |
| 2006/0085518 | A1 * | 4/2006 | Blackmore et al. | 709/217 |
| 2008/0005297 | A1 * | 1/2008 | Kjos et al. | 709/223 |
| 2008/0229006 | A1 * | 9/2008 | Nsame et al. | 711/104 |
| 2008/0262821 | A1 * | 10/2008 | Phan et al. | 703/21 |

* cited by examiner

Primary Examiner — Charles E Anya
Assistant Examiner — Shih-Wei Kraft
(74) Attorney, Agent, or Firm — Suiter Swantz pc llo

(57) ABSTRACT

A message tracking and verifying system for verifying the correctness of messages being passed may comprise a tracking module for tracking a request message and a verifying module for verifying a response message. The tracking module may be configured to store a calculated source address and a calculated response address range. The verifying module may be configured to obtain an actual source address from the response message and an actual response address range for the response message. The correctness of the response message is determined based on the comparison of the calculated source address with the actual source address and the comparison of the calculated response address range with the actual response address range.

6 Claims, 4 Drawing Sheets

METHOD FOR TRACKING AND/OR VERIFYING MESSAGE PASSING IN A SIMULATION ENVIRONMENT

TECHNICAL FIELD

The present disclosure generally relates to the field of message passing, and more particularly to method for tracking and/or verifying message passing in a simulation environment.

BACKGROUND

A simulation environment (also known as a test bench) may be utilized to verify the correctness and soundness of a design and/or model. It may be necessary to verify the integrity of messages being passed in a simulation environment utilizing a Message Passing Interface (MPI). Such verifications may require additional steps to be implemented in a test stimulus in addition to functionality testing. Further complicating matters, more than one test stimulus may be required to test the design and/or model in the simulation environment, requiring message verifications to be implemented for each test stimulus.

SUMMARY

A message tracking and verifying system for verifying the correctness of messages being passed may comprise a tracking module for tracking a request message and a verifying module for verifying a response message. The tracking module may be configured to store a calculated source address and a calculated response address range. The verifying module may be configured to obtain an actual source address from the response message and an actual response address range for the response message. The correctness of the response message is determined based on the comparison of the calculated source address with the actual source address and the comparison of the calculated response address range with the actual response address range.

A method for tracking and verifying correctness of messages being passed may comprise calculating and storing a source address for a request message; calculating and storing a response address range for a response message; obtaining an actual source address from the response message; obtaining an actual response address range for the response message; retrieving the calculated source address and the calculated response address range; and determining correctness of the response message based on the comparison of the calculated source address with the actual source address and the comparison of the calculated response address range with the actual response address range.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
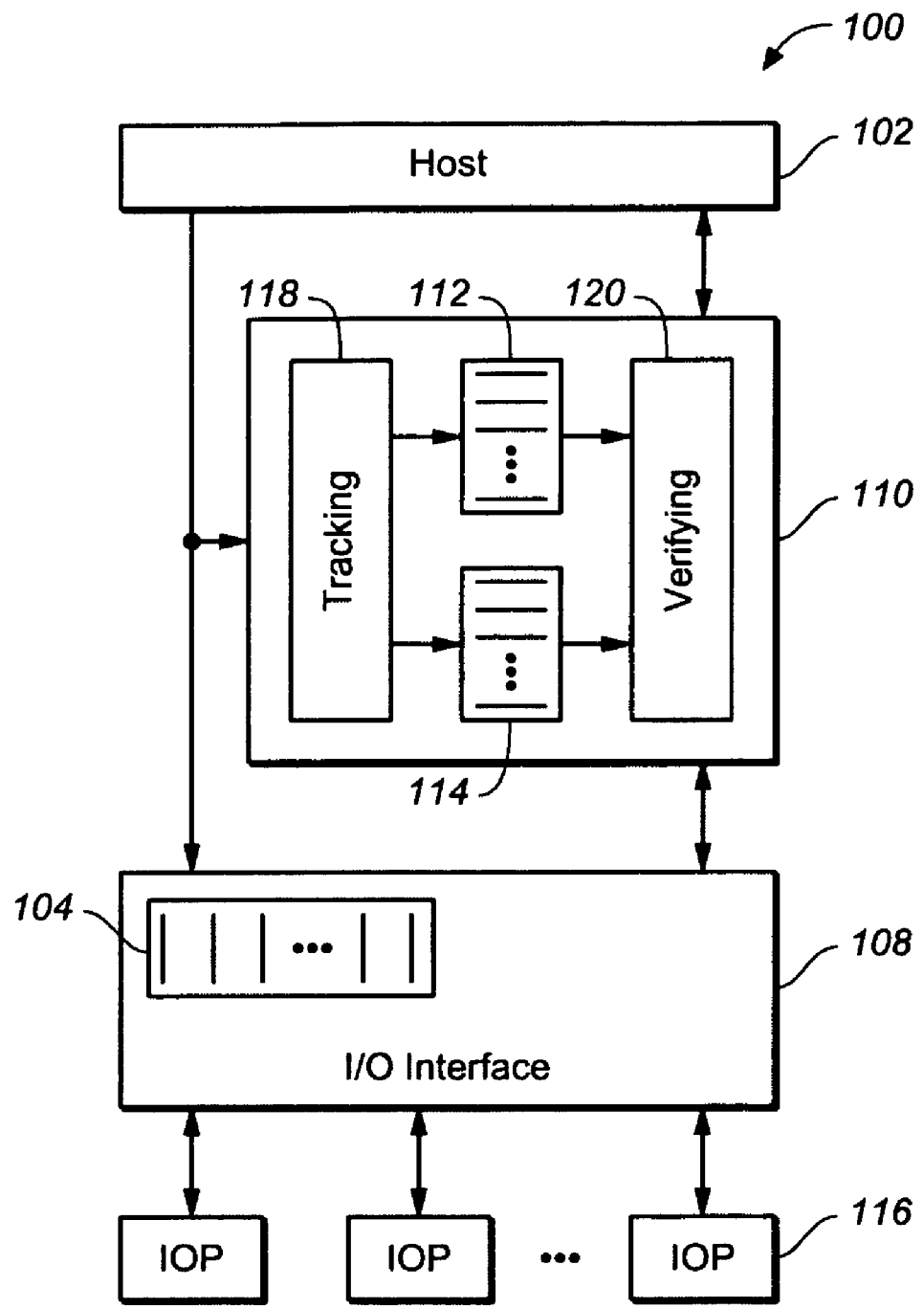
FIG. 1 is a block diagram illustrating a message tracking and verifying system.

Referring now to FIG. 1, a message passing service 100 utilizing a message tracking and verifying system 110 of the present invention is depicted. When a message pull operation provided by the message passing service is initiated by a host 102, the host 102 writes a request message into a request queue 104. The request message in the request queue 104 is accessible to an I/O interface 108, which is configured to establish interfaces with one or more applicable I/O processors 116. A response message in response to the request message is generated and passed to the host 102 to complete the message pull operation. It is understood that the request queue 104 may be configurable to store the content of the request message being passed or a pointer to the content of the request message.

The message tracking and verifying system 110 may be utilized to validate the functionality of the message passing service by tracking and verifying messages being passed. Such validation may be applicable for example, in a simulation environment (also known as a test bench) for verifying the integrity of messages, therefore reducing the necessity of handling message testing in a test stimulus in addition to functionality testing. The message tracking and verifying system 110 comprises a tracking module 118 for tracking a request message, and a verifying module 120 for verifying a response message in response to the request message. A module may refer to a portion of a program that executes a function which may be executed individually or in combination with other modules. It is contemplated that tracking module 118 and verifying module 120 may be implemented as software, firmware or hardware or a combination of software, firmware and hardware.

The tracking module 118 tracks a request message initiated by the host 102. When the host 102 writes a request message into the request queue 104, the tracking module 118 analyzes the descriptor of the request message and calculates the source address of the request message. The calculated source address is stored in a calculated source address queue 112. The tracking module 118 also calculates an address range where a response message will be written. The calculated response address range is stored in a calculated response address queue 114. The calculated source address queue 112 and the calculated response address queue 114 may be implemented as an internal or as an external storage spaces to the message tracking and verifying system 110.

The verifying module 120 verifies a response message provided by a device under test in response to the request message. In one instance, the device under test is the I/O interface 108, which processes the request message written by the host 102 and sends the response message to the host 102 to complete the message pull operation. When the host 102 receives a memory read signal indicating that the response message is ready for retrieval, the verifying module 120 compares the actual source address information obtained from the descriptor of the response message against the calculated source address for correctness. The host 102 then sends a completion signal in response to the read signal. The device under test converts/passes the completion signal as a write signal, and the response message is then written to a memory space accessible to the IOP 116 (e.g., a Processor Local Bus memory). The actual memory address (destination address) where the response message is written is compared against the corresponding calculated response address range for correctness. The verifying module 120 may be configured to send a completion signal after the response message is received and the correctness of the response message is verified.

Figure 2:
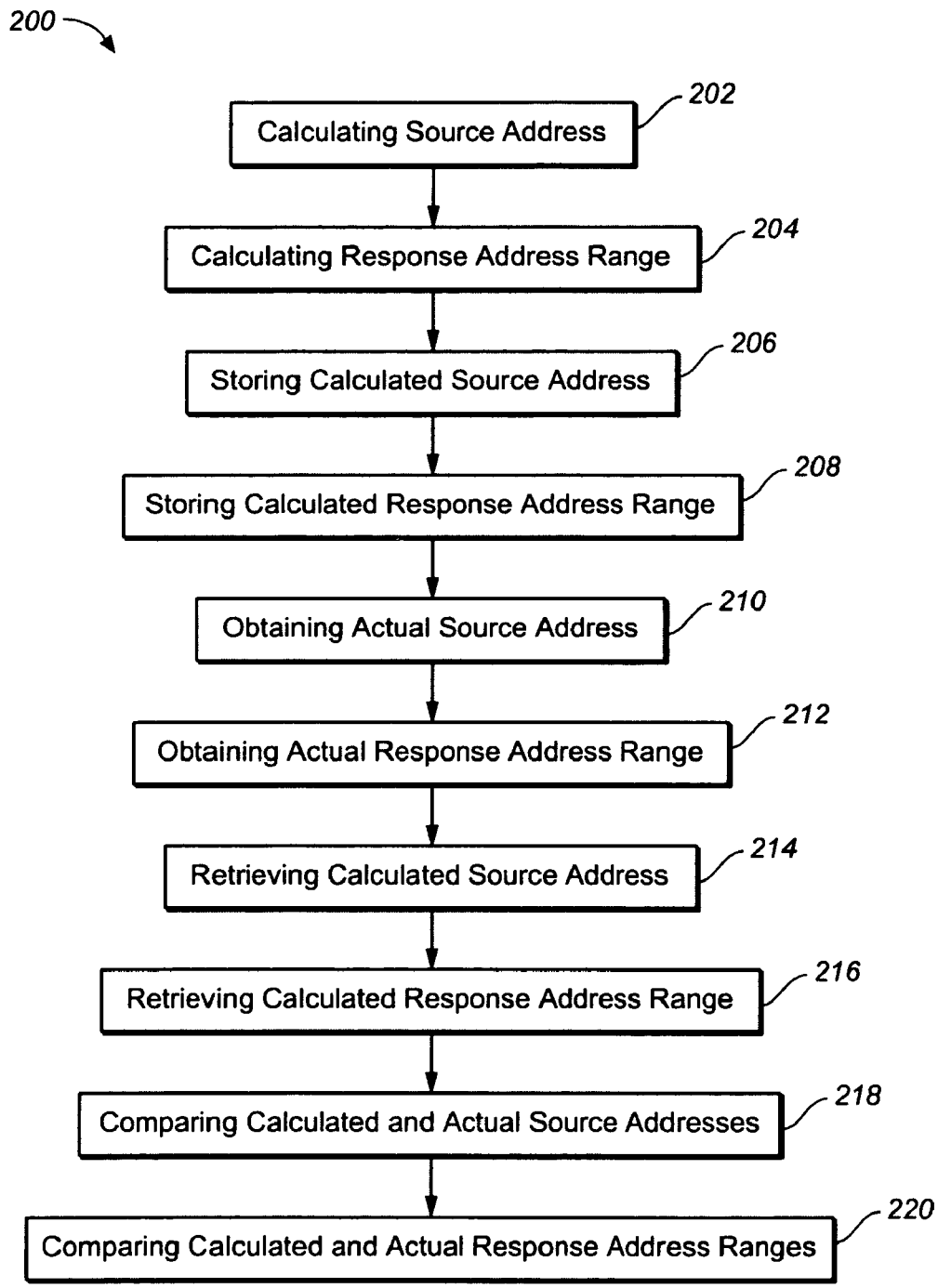
FIG. 2 is a flow diagram illustrating the basic steps performed by a tracking and verifying method in accordance with the invention; and FIG. 3A

FIG. 2 depicts a flow diagram illustrating the basic steps performed by a message tracking and verifying method 200 in accordance with the present invention. When a request message is processed by the message passing service, step 202 calculates a calculated source address of the request message. Step 204 calculates a calculated response address range of response messages in response to the request message. Step 206 stores the calculated source address in a calculated source address queue. Step 208 stores the calculated response address range in a calculated response address queue. When a response message is received, step 210 obtains an actual source address from the response message received. Step 212 obtains an actual response address range from the response message received. The calculated source address and the calculated response address range are retrieved from the calculated source address queue and the calculated response address queue, respectively, in step 214 and 216. The correctness of the messages being passed is verified in steps 218 and 220. Step 218 compares the calculated source address with the actual source address, and step 220 compares the calculated response address range with an actual response address range.

Figure 3A:
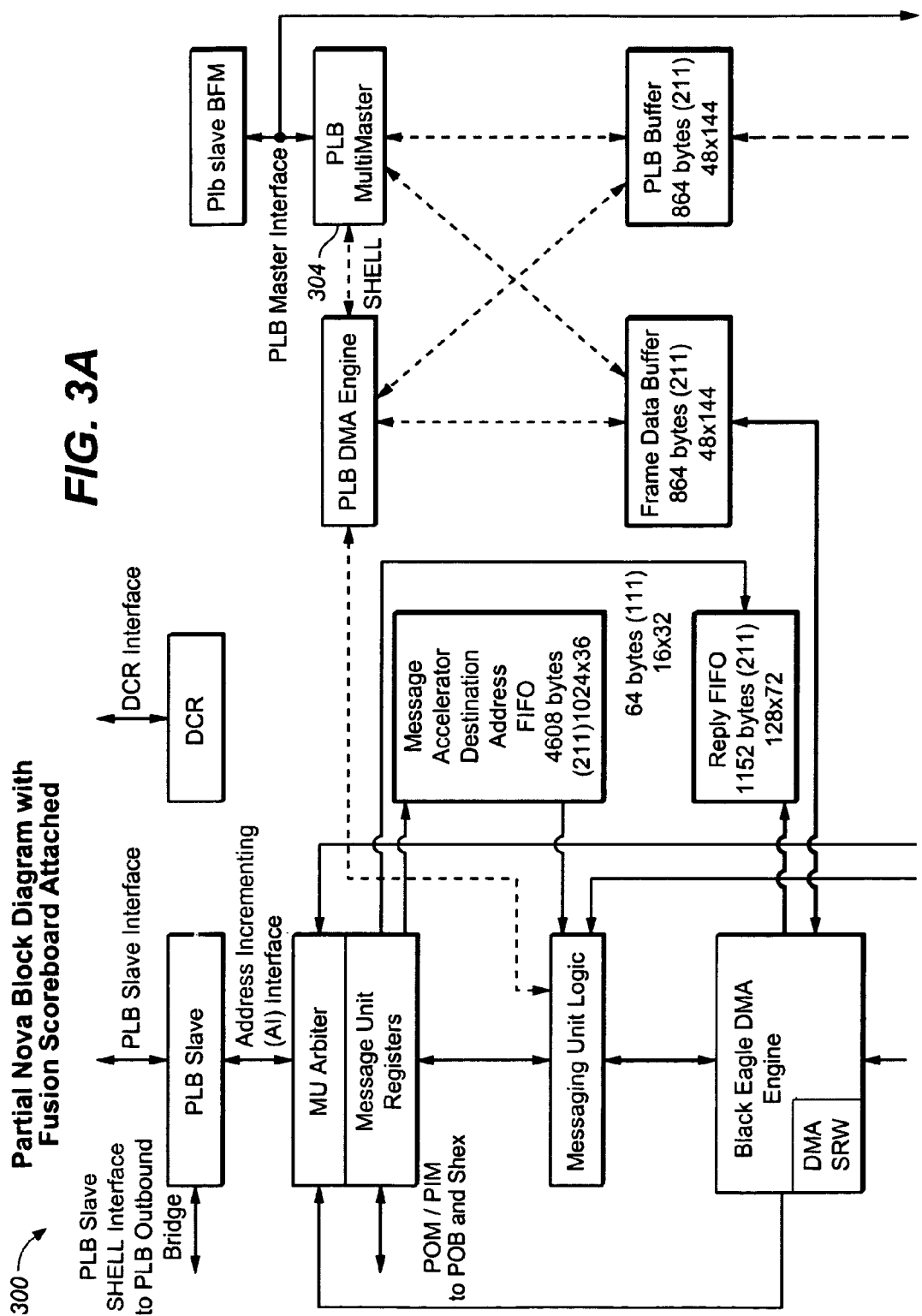
FIG. 3B is another block diagram illustrating a message tracking and verifying system.
Figures 3, 3B:
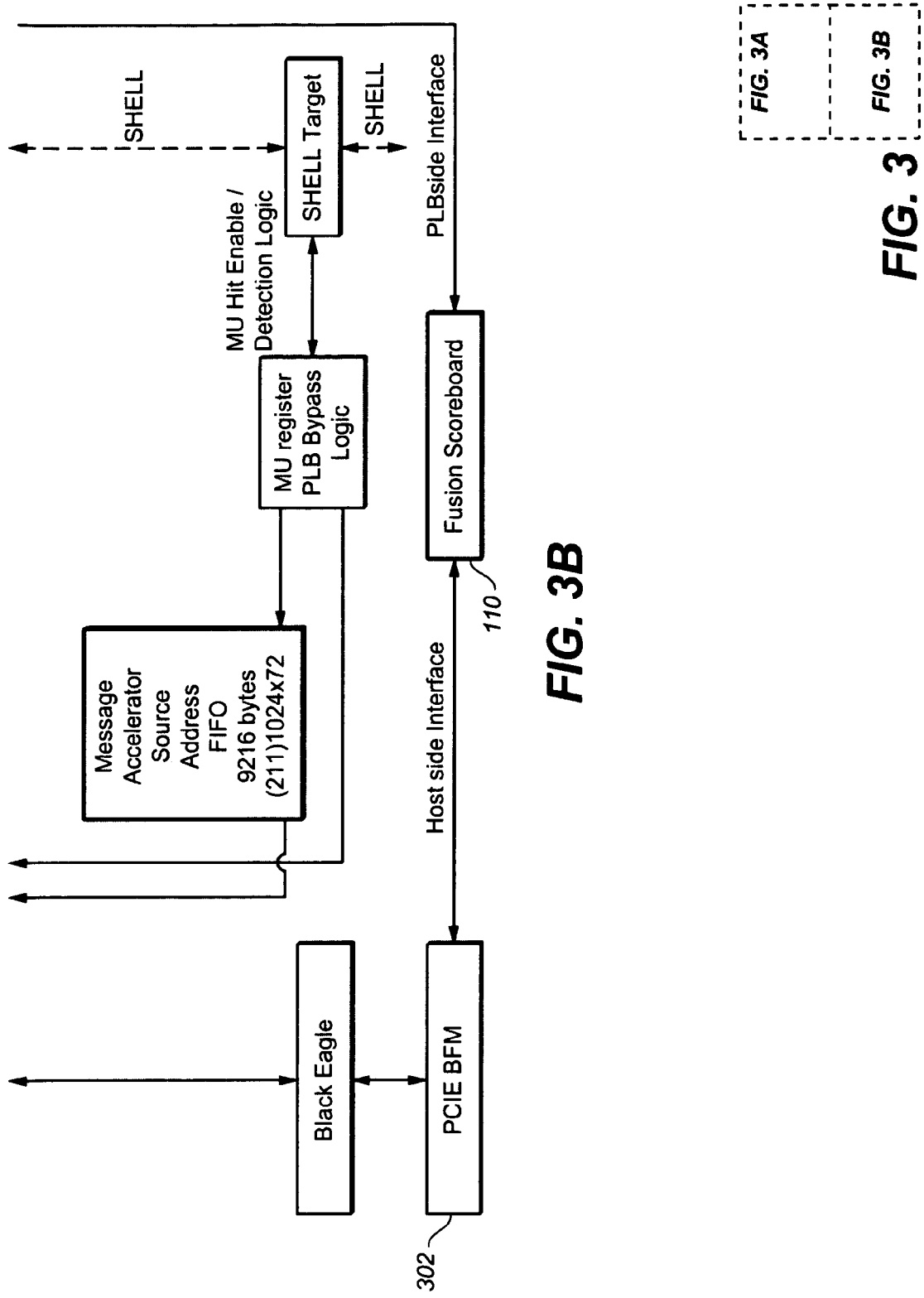

Referring now to FIG. 3A and FIG. 3B, a simulation environment 300 utilizing a message tracking and verifying system 110 of the present invention is depicted. In a specific embodiment, the simulation environment 300 is configured for a Fusion-MPT (Message Passing Technology) architecture utilizing a Peripheral Component Interconnect Express (PCIe) interface. The message tracking and verifying system 110 comprises connections from a PCIe BFM (a software model simulating behaviors of a PCIe) 302 (host) and a Processor Local Bus (PLB) Master 304 (I/O interface).

When the PCIe BFM 302 writes a request message into Request Post FIFO (request queue) of the Fusion-MPT architecture, the tracking module analyzes the descriptor of the request message and calculates the source address of the request message. The calculated source address is stored in a calculated source address queue. The tracking module also analyzes Request Free FIFO of the Fusion-MPT architecture and calculates an address range where a response message will be written. The calculated response address range is stored in a calculated response address queue. In a specific embodiment, the calculated source address queue and the calculated response address queue are implemented as First-In-First-Out (FIFO) storage spaces internal to the message tracking and verifying system 110. However, it is contemplated that other data structures may be utilized as desired.

The PCIe BFM 302 receives a PCIe Memory Read command from a device under test (the PLB Master 304) when a response message is available. The verifying module retrieves the response message and compares the actual source address information obtained from the descriptor of the response message against the corresponding calculated source address for correctness. The PCIE BFM 302 then sends a completion signal in response to the read command. The device under test converts/passes the completion signal as a PLB write signal from the PLB Master 304. The response message is then written to an internal memory model via a Fusion Messaging Unit (FMU) PLB Master of the Fusion-MPT architecture. The verifying module is configured to obtain the actual memory address where the response message is written based on the PLB protocol utilized by the FMU PLB Master. The actual memory address is compared against the corresponding calculated response address range for correctness. In a specific embodiment, the verifying module is configured to send a completion signal acting as the host after the response message is received and the correctness of the response message is verified.

It is contemplated that the message tracking and verifying system 110 may be configured to traverse through the messages written at the memory space accessible to the host, and calculates/predicts applicable chain addresses. A chain address identifies a physically contiguous portion of memory containing additional information associated with a message. For example, a message may include a chain element having chain address information (e.g., a scatter gather list, SGL) for identifying the next memory segment containing the continuation of the message. This configuration enables the message tracking and verifying system 110 to track and verify message pull operations performed on messages utilizing chain addresses (also known as chained messages). In one embodiment, the tracking module 118 traverses through the host message to identify all non-zero chain elements (non-zero indicates a reference to a valid memory segment). The tracking module then calculates the source address and response address based on the non-zero chain elements identified. The calculated source address and response address are stored in corresponding source address and response address queues for verifying the correctness of the device under test. It is further contemplated that with the message tracking and verifying system 110 configured to send completion signals as a host, randomization of simulation stimuli may be introduced relatively easily. It will be appreciated that the message tracking and verifying system 110 of the present invention may be portable to alternative simulation environments.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A message tracking and verifying system, comprising:
  a tracking module for tracking a request message, the tracking module configured to calculate a calculated source address of the request message and store the calculated source address in a calculated source address queue, the tracking module also configured to calculate a calculated response address range of a response message and store the calculated response address range in a calculated response address queue;
  a verifying module for verifying the response message of the request message, the verifying module configured to retrieve the calculated source address from the calculated source address queue, the verifying module also configured to retrieve the calculated response address range from the calculated response address queue; and
  a message passing service, wherein the tracking module and the verifying module are configured to verify a message passed in the message passing service, the message passing service is configured for a Fusion-MPT (Message Passing Technology) architecture utilizing a Peripheral Component Interconnect Express (PCIe) interface, wherein the verifying module is configured to verify correctness of the response message utilizing the calculated source address and the calculated response address range and is configured to track and verify chain addresses, the verifying module configured to send a completion signal after the response message is received and the correctness of the response message is verified, wherein the verifying module is configured to obtain the actual response address range for the response message based on processor local bus (PLB) utilized by a Fusion Messaging Unit PLB Master, wherein the tracking module traverses a host message to identify all non-zero elements, wherein the tracking module calculates the source address and the response address range based upon the non-zero elements identified.

2. The message tracking and verification system of claim 1, wherein the verifying module is configured to verify correctness of the response message by comparing the calculated source address with an actual source address obtained from the response message, and comparing the calculated response address range with an actual response address range for the response message.

3. The message tracking and verification system of claim 1, wherein the calculated source address queue and the calculated response address queue are implemented utilizing First-In-First-Out (FIFO) data structures.

4. A message tracking and verifying system, comprising:
means for tracking a request message, the tracking means configured to calculate a calculated source address of the request message and store the calculated source address in a calculated source address queue, the tracking means also configured to calculate a calculated response address range of a response message and store the calculated response address range in a calculated response address queue;

means for verifying the response message of the request message, the verifying means configured to retrieve the calculated source address from the calculated source address queue, the verifying means also configured to retrieve the calculated response address range from the calculated response address queue; and a message passing service, wherein the tracking means and the verifying means verify a message passed in the message passing service, the message passing service is configured for a Fusion-MPT (Message Passing Technology) architecture utilizing a Peripheral Component Interconnect Express (PCIe) interface, wherein the verifying means is configured to verify correctness of the response message utilizing the calculated source address and the calculated response address range and is configured to track and verify chain addresses, the verifying means configured to send a completion signal after the response message is received and the correctness of the response message is verified, wherein the verifying means is configured to obtain the actual response address range for the response message based on processor local bus (PLB) protocol utilized by a Fusion Messaging Unit PLB Master, wherein the tracking means traverses a host message to identify all non-zero elements, wherein the tracking means calculates the source address and the response address range based upon the non-zero elements identified.

5. The message tracking and verification system of claim 4, wherein the verifying means is configured to verify correctness of the response message by comparing the calculated source address with an actual source address obtained from the response message, and comparing the calculated response address range with an actual response address range for the response message.

6. The message tracking and verification system of claim 4, wherein the calculated source address queue and the calculated response address queue are implemented utilizing First-In-First-Out (FIFO) data structures.

* * * * *